(12) United States Patent
Scavuzzo

(10) Patent No.: US 8,493,716 B2
(45) Date of Patent: Jul. 23, 2013

(54) LOCKING CAGE FOR ELECTRONIC MODULES

(75) Inventor: John P. Scavuzzo, Morrisville, NC (US)

(73) Assignee: International Business Machines Corporation, Armonk, NY (US)

( * ) Notice: Subject to any disclaimer, the term of this patent is extended or adjusted under 35 U.S.C. 154(b) by 210 days.

(21) Appl. No.: 12/870,103

(22) Filed: Aug. 27, 2010

(65) Prior Publication Data

US 2012/0049699 A1    Mar. 1, 2012

(51) Int. Cl.
*G06F 1/16* (2006.01)
(52) U.S. Cl.
USPC .................. 361/679.01; 710/105; 455/456.2; 439/884
(58) Field of Classification Search
USPC ............... 714/6, 7; 710/8, 303, 304, 105, 62; 361/679.22, 679.44, 679.43, 679.08, 679.58, 361/679.33, 679.02, 679.4, 679.17, 679.21, 361/679.56, 679.41, 679.26, 679.07, 679.27; 455/557, 415, 420, 566, 556.1, 402.5, 574, 455/404.2, 456.2, 411, 423; 312/223.1, 223.2; 358/1.13, 1.9; 439/142, 131, 884, 76.1
See application file for complete search history.

(56) References Cited

U.S. PATENT DOCUMENTS

| | | | |
|---|---|---|---|
| 5,011,418 A | 4/1991 | Perzentka, Jr. | |
| 6,247,944 B1 | 6/2001 | Bolognia et al. | |
| 6,252,514 B1 | 6/2001 | Nolan et al. | |
| 6,252,765 B1 | 6/2001 | Balzaretti et al. | |
| 6,680,840 B2 | 1/2004 | Brooks | |
| 6,906,918 B2* | 6/2005 | Rabinovitz | 361/679.48 |
| 6,957,351 B2 | 10/2005 | Emberty et al. | |
| 6,995,973 B2 | 2/2006 | Barsun et al. | |
| 7,167,371 B2 | 1/2007 | Coles et al. | |
| 7,239,522 B2 | 7/2007 | Rust et al. | |
| 7,307,835 B1 | 12/2007 | Barina et al. | |
| 7,420,813 B2* | 9/2008 | Yang | 361/732 |
| 7,570,484 B1 | 8/2009 | Sivertsen | |
| 7,626,812 B2 | 12/2009 | Chang et al. | |
| 2006/0041783 A1* | 2/2006 | Rabinovitz | 714/6 |
| 2006/0067063 A1 | 3/2006 | Stahl et al. | |
| 2010/0079936 A1 | 4/2010 | Bridges et al. | |
| 2011/0032665 A1* | 2/2011 | Huang et al. | 361/679.01 |
| 2011/0109829 A1* | 5/2011 | Mathew et al. | 349/58 |

* cited by examiner

*Primary Examiner* — Hung Duong
(74) *Attorney, Agent, or Firm* — Cynthia G. Seal; Jeffrey L. Streets

(57) ABSTRACT

A cage assembly for supporting electronic modules includes first and second support positions for first and second electronic modules, a detector for reacting to the presence of the first electronic module in the first support position and a locking mechanism configured to lock the second electronic module in the second position, wherein the presence of the first electronic module in the first position blocks premature actuation to release the locking mechanism.

24 Claims, 3 Drawing Sheets

LOCKING CAGE FOR ELECTRONIC MODULES

BACKGROUND

The present invention relates to cages for supporting electronic modules, and more specifically, to cages for supporting and securing electronic modules.

Serviceability and usability have driven mechanical enclosure designs for servers and computer systems to incorporate tool-less mounting and removal of hardware, devices and other electronic modules. For example, hand-actuated latches and mechanisms are often used to retain hard disk drive (HDD) backplanes on the mechanical enclosure. One or more HDDs can then be selectively attached and/or detached from the HDD backplane.

Because the electronic modules are often delicate, their attachment and removal can cause damage to the modules and/or their connectors. It is desirable, therefore, to have systems and methods for the easy attachment and detachment of electronic modules that also facilitate careful treatment of the electronic modules and their connections.

SUMMARY

According to one embodiment of the present invention, a cage for supporting electronic modules includes first and second support positions for first and second electronic modules, a detector for sensing receipt of the first electronic module in the first support position and a locking mechanism configured to lock the second electronic module in the second position in response to sensing receipt of the first electronic module in the first position.

In another embodiment, the second electronic module may include a carrier plate for tool-less attachment or removal of the second electronic module from the second position. The locking mechanism includes an actuated spring for normally-biased locking of the carrier plate to the second position of the cage. A release button of the locking mechanism is configured to overcome the actuated spring to allow tool-less removal of the carrier plate. In addition, the detector includes aspects of the actuated spring which abuts the first electronic module, when present in the first position, to prevent actuation of the release mechanism. This stops subsequent premature removal of the second electronic module.

In another aspect, the cage may further include a bay for containing the first support position, wherein the bay is configured to slidingly receive the first electronic module until the first electronic module reaches the first support position.

In another embodiment, the detector includes a spring biased lever that supports the locking mechanism. Restriction of movement of the lever is configured to occur as the first electronic module reaches the first support position. For example, the lever may extend along the bay and be configured to progressively block actuation of the release mechanism as the first electronic module is slidingly received in the bay.

The locking mechanism, in another embodiment, may include a positive portion and a negative portion that are configured to fit each other in locking engagement. One of the positive or negative portions is supported by the lever and another one of the positive or negative portions is supported by the second electronic module. Also, the cage may define an opening through which the positive portion extends when in locking engagement with the negative portion.

In another embodiment, the cage includes a plurality of first support positions contained within the bay wherein the detector is configured to react to the presence of the first electronic module. In particular, the cage may define a plurality of channels each ending at one of the first support positions and configured to slidingly receive the first electronic module. Also, the channels may be configured to support the first electronic module at a fixed angle with respect to the second electronic module.

In yet another embodiment, the detector includes a plurality of levers, each of the levers extends a long a respective one of the plurality of channels.

In another embodiment, the second position is defined by at least two spaced apart points wherein the locking mechanism is configured to lock the second electronic module in the second position at the two spaced apart points.

In another embodiment, the detector may be configured to react to removal of the first electronic module from the first position and the locking mechanism is further configured to enable unlocking the second electronic module from the second position in response thereto. The locking mechanism may include a release member that releases the unlocked second electronic module.

In other embodiments, the above-listed configurations can be implemented as a method of sensing receipt of the first electronic module in the first position, locking the second electronic module in the second position and preventing premature release of the second electronic module.

DETAILED DESCRIPTION

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The inventor has observed that removal of a HDD backplane from an HDD support or enclosure (herein a "cage") before removing the HDD device from the cage can prematurely disengage the linear docking connectors connecting the HDD with the HDD backplane in a non-linear motion. Removing the HDD backplane in a "peeling motion" vs. the required linear unplugging motion can cause subsequent damage to the connectors or the intervening printed circuit board connecting the HDD with the HDD backplane. If the connectors are damaged, there is no way to retrieve data on the HDD. Advantageously, embodiments of the present invention prevent premature removal of the HDD backplane carrier assembly until the HDDs are removed.

It should be noted that although described with reference to HDDs and an HDD backplane, embodiments of the present invention may also be used for other linear or non-linear electronic components (e.g., circuit boards, peripherals, controllers, etc.) that are supported by cage structures in positions to be able to interconnect in a required direction of motion.

Figure 1:
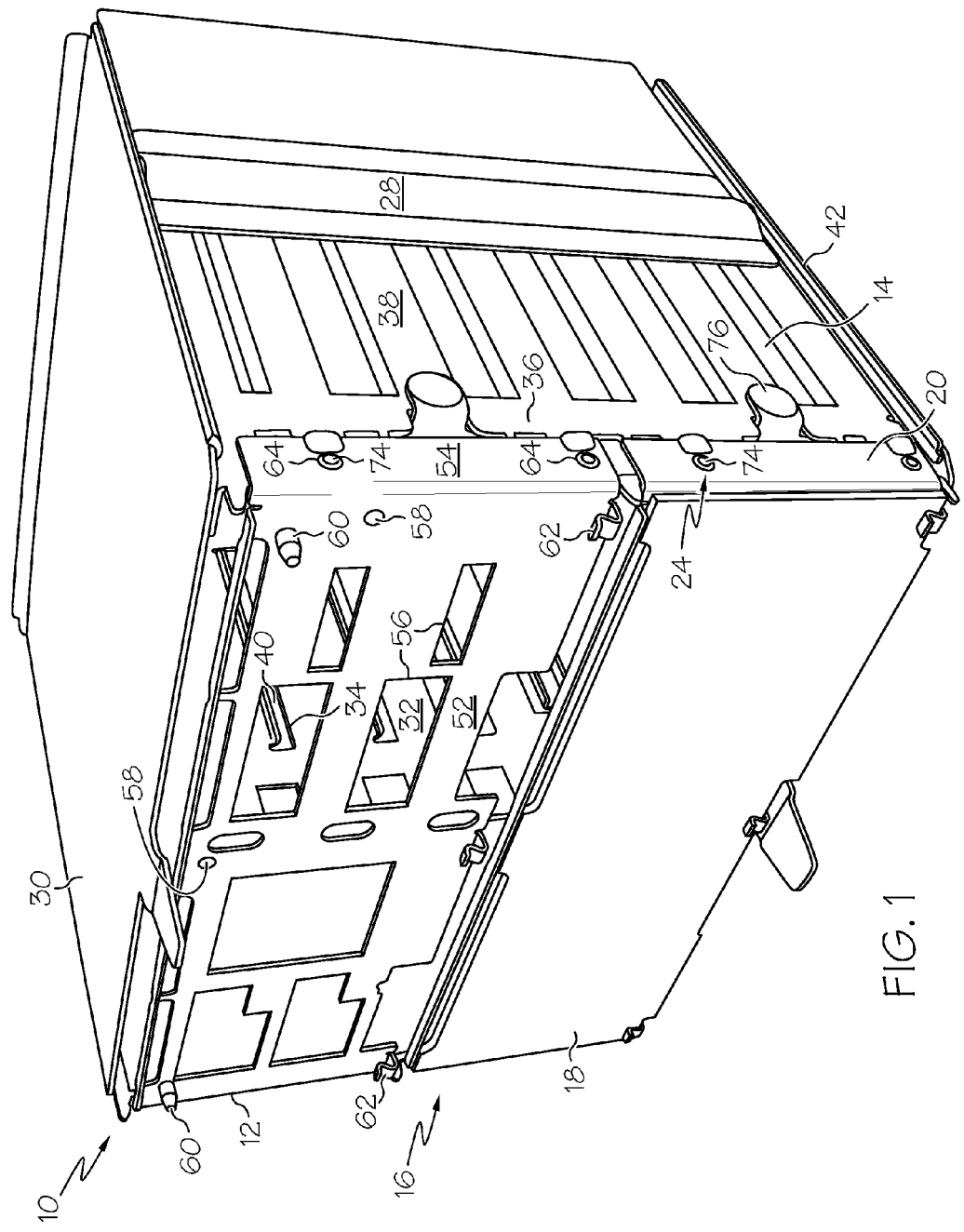
FIG. 1 shows a perspective view of a cage assembly of one embodiment of the present invention.
Figure 2:
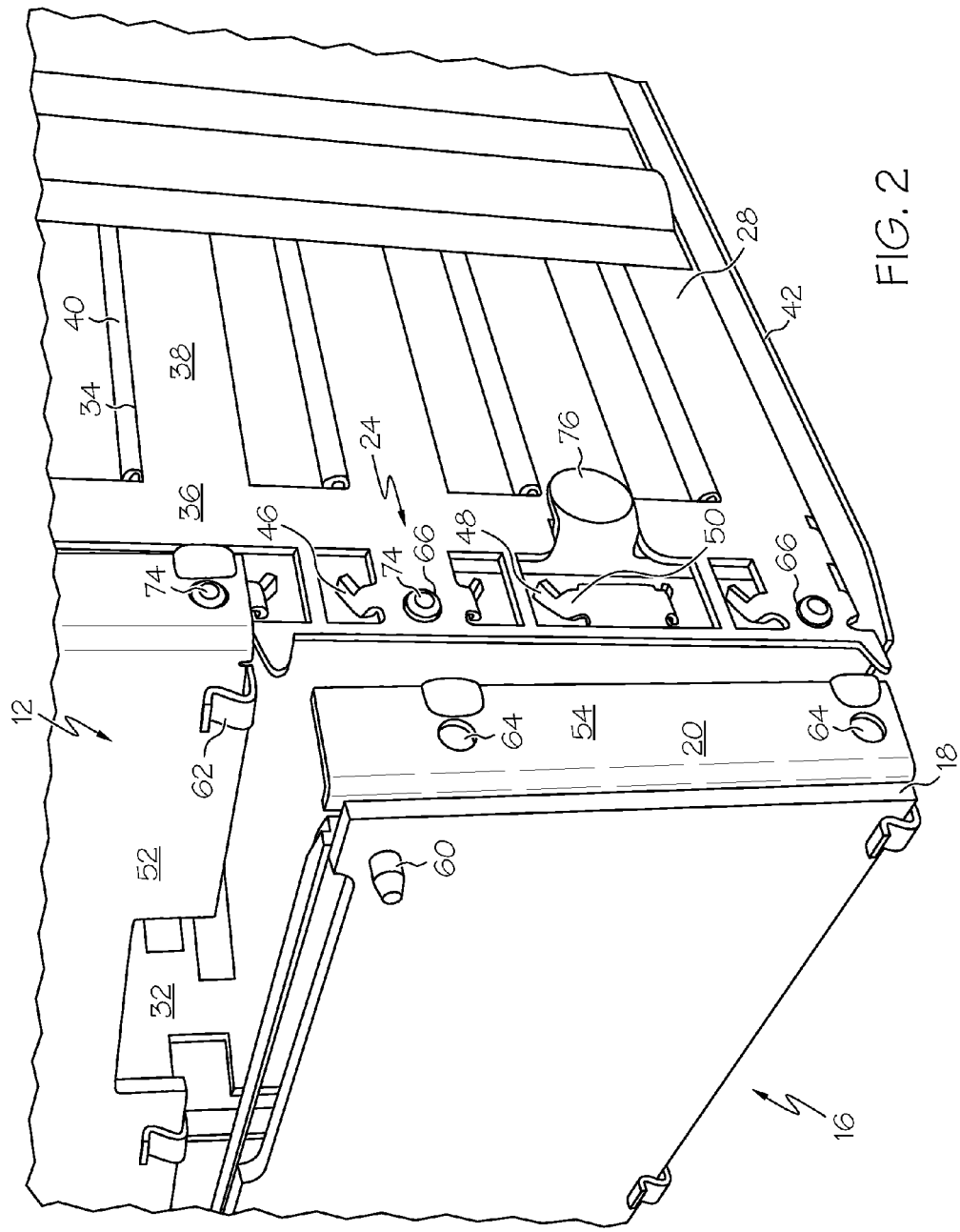
FIG. 2 shows a perspective view of removal of a HDD backplane assembly from a cage of the cage assembly of FIG. 1.
Figure 3:
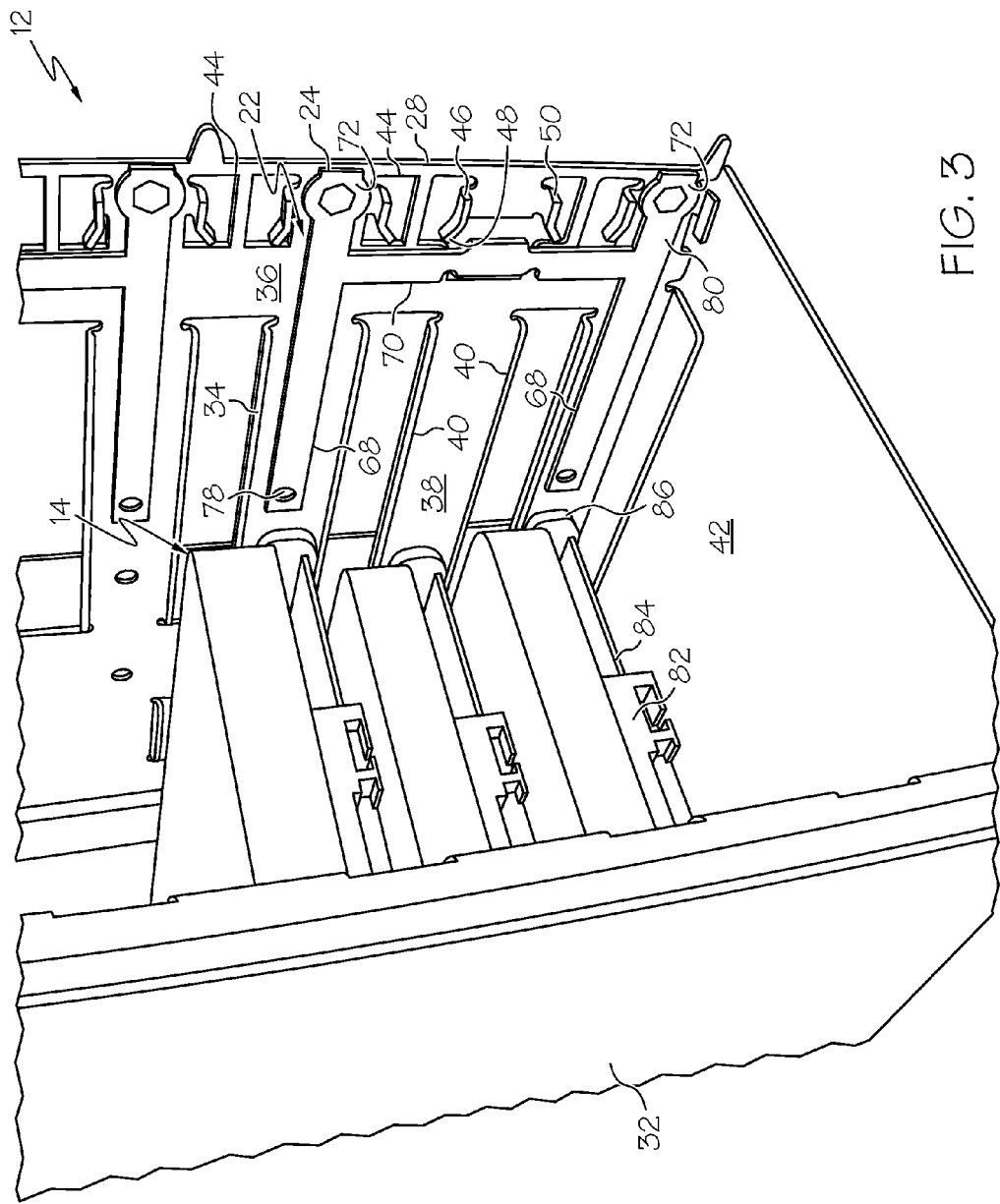
FIG. 3 shows a perspective view of removal of a plurality of HDDs from the cage of FIG. 2 and disengagement of a locking mechanism of the cage assembly of FIG. 1.

With reference now to FIGS. 1-3, a cage assembly 10 of one embodiment of the present invention includes a cage 12 supporting a plurality of first electronic modules, in this embodiment HDDs 14, in operative association with a second electronic module, in this embodiment a HDD backplane assembly 16 including a backplane 18 and a carrier plate 20. Advantageously, the cage assembly 10 may also include a "device-present" detector 22 and locking mechanism 24 that detect the presence of the HDDs 14 and block release of the HDD backplane assembly 16 from the cage 12 until the HDDs are at least partially removed from the cage 12.

The cage assembly 10 includes the device-present detector 22, locking mechanism 24 and the cage 12, as shown in FIG. 1. The cage 12 includes walls that interlock along their edges to form a rectangular enclosure for the HDDs 14. The walls include a pair of side walls 28, a top wall 30 and a bottom wall 42. Within the rectangular enclosure is a separating wall 32 positioned approximately midway between, and parallel to, the side walls 28.

The side walls 28 and separating wall 32 includes a plurality of rail slots 34 and end plates 36, as shown in FIG. 3. The rail slots 34 extend parallel to each other and the ground and include ends that connect to the end plates 36. Also, the rail slots 34 of the side walls 28 are in matched, corresponding pairs with rail slots of the side walls 28 to define an HDD receiving bay space therebetween.

Each of the rail slots includes a vertical portion 38 extending vertically between a pair of flanges 40. The flanges are bent inwardly into the cage 12 interior to define channels sized to receive and securely hold lateral edges of the HDDs (or assembly portions supporting the HDDs) in sliding engagement thereby acting as a HDD carrier, as shown in FIG. 2.

The end plates 36 extend vertically up from the bottom wall 42 of the cage 12 and define a plurality of rectangular openings 44, as shown in FIGS. 2 and 3. The end plates 36 include flange stops 46 which include a pair of inwardly directed flanges (portions of the vertical wall that are formed when punched in to form the openings 44) that have a wide spacing on a receipt end 48 but a narrowing spacing on a stop end 50.

The flange stops 46 are positioned to correspond with the sliding pathway defined by the flanges 40 of the rail slots 34. In this manner, the wide spacing of the flange stops at the receipt end 48 can receive edges of the HDDs 14, but the narrow spacing on the stop end 50 halts movement of the HDDs when they reach an end, or first support position. This first or end position is preferably selected to enable easy attachment of the HDDs 14 to the backplane 18.

The HDD backplane assembly includes the backplane 18 and the carrier plate 20, as shown in FIG. 2. The backplane is a printed circuit board that includes various components, including one or more connectors (not shown) that extend generally horizontally in a stacked array and are configured to receive corresponding connectors from the HDDs loaded into the cage 12. Generally, the backplane 18 operates to establish communication between the HDDs and the remaining hardware and software components of a general computer or other electronic system. Notably, the HDD backplane assembly could be any hardware, software or other "electronic component" that benefits from the coordinated interlocking of the cage assembly 10 of various embodiments of the present invention.

The carrier plate 20, as shown at the top of FIG. 1 without the backplane 18 attached, includes a back sheet 52 that supports the backplane 18 and a pair of side flanges 54 that extend at about a right angle to the back sheet 52.

Defined in the back sheet 52 are connector openings 56 through which connections are made between the electrical components, such as the HDDs and the backplane 18. Also defined in the back sheet 52 are fastener openings 58 through which fasteners can be extended to secure the backplane 18 to the carrier plate 20. Additionally, stabilizing posts 60 extend up from the carrier plate 20 and through openings defined in the backplane 18. The back sheet 52 also includes support members 62 that extend up from lower edges of the back sheet 52 to form convex surfaces.

During attachment, the support members provide a resting surface for the lower edge of the backplane 18 while its top edges are rotated to mount onto the stabilizing posts 60. Once appropriately positioned, fasteners are secured through the fastener openings 58 for a precise and tight fit of the backplane 18 and carrier plate 20, as shown in FIG. 2. In the embodiment of FIG. 1, two backplane 18 and carrier plate 20 assemblies may be secured to the back of the cage 12. Each HDD backplane assembly 16 is configured for attachment of three stacked HDDs 14 held within the cage 12 on either side of the separating wall 32.

The side flanges 54 are configured to extend around and over the back edges of the end plates 36 of the side walls 28. Defined in the side flanges 54 are a pair of negative lock openings 64. The lock openings 64 are spaced and positioned to correspond with pass-through openings 66 defined in the end plates 36 of the side walls 28 of the cage. As will be described in more detail below, the openings 64, 66 are part of the locking mechanism 24 of one embodiment of the present invention.

The device-present detector 22, in the illustrated embodiment of FIGS. 1-3, includes a pair of spring plates 68, a cross bar 70, a pair of pin plates 72, a pair of positive pins 74 and a release push-button tab 76. Each of the spring plates 68 includes a fixed end 78 and a free end 80. The fixed end 78 is fixed to the vertical portion 38 of one of the rail slots 34. The spring plate extends from the fixed end 78 to the free end 80 in cantilever fashion along the vertical portion 38 and between the flanges 40 of its respective one of the rail slots 34, as shown in FIG. 3. In the illustrated embodiment, an intervening one of the rail slots 34 does not include its own spring plate, but could in other embodiments.

The cross bar 70 is a plate extending vertically, and at a right angle, past the unoccupied one of the rail slots 34 to connect a pair of two parallel spring plates 68 in an "H" configuration. A flange extends from a central portion of the cross bar 70 and through one of the rectangular openings 44 in the end plates 36 to be bent back into a release push-button tab 76 that parallels the end plate outer surface, as shown in FIG. 2.

The release push-button tab 76 of the spring plate 68 is formed in a "dog-leg" offset in order to loosely sandwich the side wall 28 of cage 12 between the inside surface of the release push-button tab 76 and the outside surface of the free end 80 of spring plate 68. This offset feature allows only enough deflection of the locking mechanism 24 to ensure complete disengagement of positive pins 74 thus preventing permanent yielding of the non-spring steel material of spring plate 68 due to over-deflection during release actuation.

The pin plates 72 are each supported by the free end 78 of a respective one of the spring plates 68. The pin plates 72 have a circular or disc shape, each supporting at its center one of the positive pins 74. The positive pins 74 (as shown in FIGS. 1 and 2) are cylindrical pins configured to fit snugly through the pass-through openings 66 in the cage 12 and lock openings 64 of the carrier plate 20. Advantageously, the extra portion of the pin plates 72 that exceed the diameter of the pins 74 act as a stop on the internal surface of the end plates 36. Also advantageously, the "H" configuration connects articulation of the two spring plates 68 so that movement of the positive pins is coordinated to provide two securing points for the carrier plate 20 and backplane 18.

Each of the HDDs 14 includes the disk drive 82, a connecting printed circuit board (PCB) 84 and a rail sled 86, as shown in FIG. 3. The disk drive 82 preferably extends horizontally and is supported above and along the connecting PCB 84. This assembly is in turn supported on the rail sled 86 which is a carrier for the more delicate disk drive 82 and connecting PCB 84 components. The rail sled 86 includes rails with rounded front ends shaped and sized to slide along between the flanges 40 adjacent the vertical portion 38 of the rail slots 34.

During assembly of the cage assembly 10, the HDD backplane assembly 16 is attached by placing the carrier plate 20 against the back of the cage 12 so that the side flanges 54 extend over the end plates 36, as shown in FIG. 2. The lock openings 64 are positioned to correspond to the pass-through openings 66, at which point the spring bias of the cantilevered spring plates 68 acts as a lever to advance the positive pins 74 to extend through the pass-through and lock openings. The release button 76 also springs outwards, away from the end plates 36, at this point to firmly lock the HDD backplane assembly 16 onto the cage 12 in a fixed, second support position, as shown in FIG. 1.

Once the HDD backplane assembly 16 is in place, the HDDs 14 are slid (as shown in FIG. 3, but lacking the backplane assembly for visualization) with the rail sled 86 in along the flanges 40 of the rail slots until the reaching its end position. At this end position, a connector extending from each of the connecting PCBs 84 is urged by the linear sliding motion to a receiving connector of the array supported by the backplane 18. Because the lateral edges of the rail sled 86 ride in the flanges 40, the spring plates 68 are held against the vertical portion 38 of the rail slots 34, further securing the positive pins 74 within the pass-through and lock openings 66, 64. Also, advantageously, the linear motion of the HDDs 14 serves to facilitate connection at a preferred angular position between the backplane and HDD, such as at the illustrated right angle, to avoid peeling damage. Other angles could also be employed, such as 30 or 60 degree angles.

Advantageously, attempts to depress the release button 76 will be substantially inhibited by the presence of even one of the HDDs 14. Also, because of the use of multiple positive pins 74 (2, 3, 4 or more pins), and attempt to tilt or peel the backplane assembly 16 from the cage 12 is inhibited, avoiding damaging disconnection of the connecting PCB 84 and backplane 18. Notably, even the central one of the three HDDs in the illustrated embodiment blocks movement of the cross bar 70 and the whole "H" configuration.

In disassembly, the spring plates 68 act as a sensor or detector in that they progressively are freed to move only as the HDDs 14 are slid further along the rail slots 34 outwards from the cage 12, as shown in FIG. 3. Progressive release of the spring plates 68 to move allows progressively easier depression of the release button 76 and retraction of the positive pins 74 from the lock openings 64 and pass-through openings 66. This retraction releases the carrier plate 20 and backplane 18 to be pulled off the cage 12.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. For example, the device-present detector 22 could include other mechanical, electrical or combination sensors that detect the presence or absence of the HDDs and effect locking of the HDD backplane assembly 16. Further, the locking mechanism 24 could employ a range of mechanical locking devices that include cams, levers and/or electrically actuated magnets or solenoids. The embodiment was chosen and described in order to best explain the principles of the invention and the practical application, and to enable others of ordinary skill in the art to understand the invention for various embodiments with various modifications as are suited to the particular use contemplated.

What is claimed is:

1. A cage for supporting a first and second interconnecting electronic modules, the cage comprising:
 a first support position configured to support the first electronic module;
 a second support position configured to support the second electronic module, the first and second support positions relatively arranged to enable interconnection of the first and second electronic modules in communication;
 a detector configured to react to the first electronic module occupying the first support position; and
 a locking mechanism configured to lock the second electronic module in the second support position in response to the detector reacting to the presence of the first electronic module in the first support position.

2. The cage of claim 1, further including a bay containing the first support position, the bay configured to slidingly receive the first electronic module until the first electronic module reaches the first support position.

3. The cage of claim 2, wherein the detector includes a spring biased lever that supports and biases the locking mechanism into the locked position for the retention of the second electronic module.

4. The cage of claim 3, wherein the lever extends along the bay and is configured to progressively block actuation of the release mechanism as the first electronic module is slidingly received in the bay.

5. The cage of claim 4, wherein the locking mechanism includes a positive portion and a negative portion, wherein one of the positive or negative portions is supported by the lever and the other one of the positive or negative portions is supported by the second electronic module and wherein the positive portion is configured to fit into the negative portion in locking engagement.

6. The cage of claim 5, wherein the cage defines an opening through which the positive portion extends when in locking engagement with the negative portion.

7. The cage of claim 6, wherein the cage includes a plurality of first support positions contained within the bay and wherein the detector is configured to react to the first electronic module occupying one of the first support positions.

8. The cage of claim 7, wherein the cage defines a plurality of channels each ending at one of the first support positions and configured to slidingly receive the first electronic module.

9. The cage of claim 8, wherein the detector includes a plurality of levers, each of the levers extending along a respective one of the plurality of channels.

10. The cage of claim 1, wherein the second position is defined by at least two spaced-apart points and wherein the locking mechanism is configured to lock the second electronic module in the second support position at the two spaced apart points.

11. The cage of claim 10, further comprising a channel configured to slidingly receive the first electronic module.

12. The cage of claim 11, wherein the channel is configured to support the first electronic module at a fixed angle with respect to the second electronic module.

13. The cage of claim 12, wherein the fixed angle is configured to enable linear connection of the first and second electronic modules.

14. The cage of claim 1, wherein the detector is further configured to react to the removal of the first electronic module from the first support position and the locking mechanism is further configured to unlock the second electronic module from the second position in response thereto.

15. The cage of claim 14, wherein the locking mechanism includes a release member that enables releases the second electronic module from the second position.

16. A method comprising:
  reacting to the presence of a first electronic module in a first support position of a cage;
  locking a second electronic module in a second position of the cage in response to the presence of the first electronic module in the first support position, wherein locking includes mating a positive and negative portions, and wherein one of the positive or negative portions is supported by the detector and the other one of the positive or negative portions is supported by the second electronic module; and
  enabling unlocking the second electronic module from the second support position in response to departure of the first electronic module from the first support position.

17. The method of Claim 16, wherein locking further includes extending the positive portion through an opening defined in the cage.

18. The method of claim 17, wherein unlocking includes one of separating the positive portion from the negative portion and the opening in the cage.

19. The method of claim 16, wherein locking the second electronic module in the second position includes locking the second electronic module at two spaced apart points.

20. The method of claim 19, further comprising:
  supporting the first electronic module at a fixed angle with respect to the second electronic module.

21. The method of claim 20, further comprising:
  slidingly receiving the first electronic module at the fixed angle into the first position to facilitate linear connection of the first and second electronic modules.

22. The method of claim 21, wherein reacting to the presence of the first electronic module includes progressively blocking release of the second electronic module from the second position as the first module slides into the first position.

23. The method of claim 22, further comprising:
  unlocking the second electronic module in response to activation of a release member.

24. The method of claim 20, wherein the fixed angle is a right angle.

* * * * *